(12) United States Patent
Sarkissian

(10) Patent No.: US 6,200,146 B1
(45) Date of Patent: Mar. 13, 2001

(54) RIGHT ANGLE CONNECTOR

(75) Inventor: Vicken Roben Sarkissian, Irvine, CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 09/511,685

(22) Filed: Feb. 23, 2000

(51) Int. Cl.⁷ .................................................. H01R 12/00
(52) U.S. Cl. ............................... 439/79; 439/931; 439/83
(58) Field of Search .................... 439/541.5, 79, 439/85, 83, 284, 290, 630, 631, 931; 174/260, 261, 267; 361/760, 772, 773, 785

(56) References Cited

U.S. PATENT DOCUMENTS

| | | | |
|---|---|---|---|
| 3,594,698 | 7/1971 | Anhalt | 439/261 |
| 3,772,632 | 11/1973 | Rattcliff et al. | 439/73 |
| 4,600,256 | * 7/1986 | Anttila | 439/65 |
| 4,921,453 | 5/1990 | O'Brien | 439/630 |
| 4,964,806 | * 10/1990 | Sakamoto et al. | 439/79 |
| 4,969,842 | 11/1990 | Davis | 439/629 |
| 4,977,668 | 12/1990 | McKenzie, Jr. | 29/852 |
| 5,030,113 | * 7/1991 | Wilson | 439/80 |
| 5,080,609 | * 1/1992 | Fabian et al. | 439/540 |
| 5,133,669 | 7/1992 | Barnhouse et al. | 439/78 |
| 5,330,372 | 7/1994 | Pope et al. | 439/692 |
| 5,407,622 | 4/1995 | Cleveland et al. | 264/104 |
| 5,527,591 | 6/1996 | Crotzer et al. | 428/209 |
| 5,599,595 | 2/1997 | McGinley et al. | 428/33 |
| 5,626,483 | 5/1997 | Naitoh | 439/74 |
| 5,641,291 | 6/1997 | Sueki et al. | 439/83 |
| 5,669,789 | 9/1997 | Law | 439/620 |
| 5,688,146 | 11/1997 | McGinley et al. | 439/637 |
| 5,727,956 | 3/1998 | Mitra et al. | 439/74 |
| 5,803,771 | 9/1998 | Knapp | 439/682 |
| 5,903,440 | * 5/1999 | Blazier et al. | 361/749 |
| 5,938,455 | * 8/1999 | Glovatsky et al. | 439/74 |
| 6,059,608 | * 5/2000 | Benes | 439/620 |

* cited by examiner

Primary Examiner—Khiem Nguyen
Assistant Examiner—Son N. Nguyen
(74) Attorney, Agent, or Firm—Roger C. Turner

(57) ABSTRACT

A right angle electrical connector that uses straight contacts, rather than contacts bent at a right angle. A flat insulative plate extends rearwardly from the bottom of the connector body that is mounted over a printed circuit board. Pegs formed on the bottom of the plate are mounted in plated-through holes in the printed circuit board. Conductive traces extend from contact passages in the connector body to the flat plate and pegs to provide electrical connections between contacts mounted in the passages and the printed circuit board.

13 Claims, 4 Drawing Sheets

RIGHT ANGLE CONNECTOR

BACKGROUND OF THE INVENTION

The present invention relates generally to an electrical connector and, more particularly, to a right angle electrical connector.

In a typical right angle connector the tails of the contacts that extend from the rear of the connector body are bent at right angles, so that the ends of the tails extend downwardly for engagement in plated-through holes in a printed circuit board on which the connector is mounted. Because of the long length of the right angle bent contact tails, it is difficult to maintain the ends of the tails in precise position for insertion into the plated-through holes. To facilitate the insertion of the vertically-extending legs of the tails into the holes, typically a flat alignment plate containing rows of holes corresponding to the pattern of the vertical legs of the contact tails is pushed upwardly over the tails. This assembly procedure requires an initial precise positioning of the vertical legs of the tails to allow the alignment plate to be mounted thereon. Generally, right angle electrical connectors contain no more than three or four rows of contacts. A greater density of contacts in the connector would make mounting of the alignment plate thereon difficult, if not impractical.

It is, therefore, one object of the present invention to provide a right angle electrical connector that does not require the use of right angle bent contact tails.

It is another object of the invention to provide an adapter for a connector having conventional straight contacts to convert such connector into a right angle connector.

SUMMARY OF THE INVENTION

According to a principal aspect of the present invention, there is provided a right angle electrical connector in which a generally flat insulative plate extends rearwardly from the lower portion of the insulative body of the connector. The body contains a plurality of contact passages that extend from the front face to the rear face of the body. The rear portions of the passages contain conductive coatings therein which are engaged by the contacts mounted in the passages. A plurality of projections extend downwardly from the lower surface of the flat plate at the rear of the connector body. Conductive layers are provided on the projections. The projections are adapted to be mounted in plated-through holes in a printed circuit board on which the connector is mounted, or to have a surface mount connection to traces on the upper surface of the board. Conductive traces are formed on the connector body and the plate that extend from the conductive coatings in the contact passages to the projections to provide electrical paths from the contacts to the projections. With this arrangement, the need for right angle contacts is eliminated, and there is no need to mount an alignment plate over the vertical legs of right angle bent contact tails.

According to another aspect of the invention, there is provided a generally L-shaped adapter for converting a conventional straight contact electrical connector into a right angle connector. The adapter includes a vertically-extending upper plate and a horizontally-extending lower plate. Plated-through holes in the upper plate are aligned with the contact passages in the connector. Contact tails that extend horizontally from the rear surface of the connector body extend into the plated-through holes in the upper plate of the adapter when the adapter is pushed against the rear of the connector body. Conductive traces extend from the plated-through holes over the surface of the adapter to projections on the bottom of the lower plate for making electrical connection to either plated-through holes or surface mount pads on a printed circuit board on which the connector is mounted. Because the tails on the contacts are typically short and relatively rigid, they are precisely positioned which facilitates mounting the adapter over the ends of the tails, even if the tails are disposed in more than four rows in a high density arrangement.

The invention will be best understood from the following description when read in conjunction with the accompanying drawings.

DESCRIPTION OF THE PREFERRED EMBODIMENTS

Figure 1:
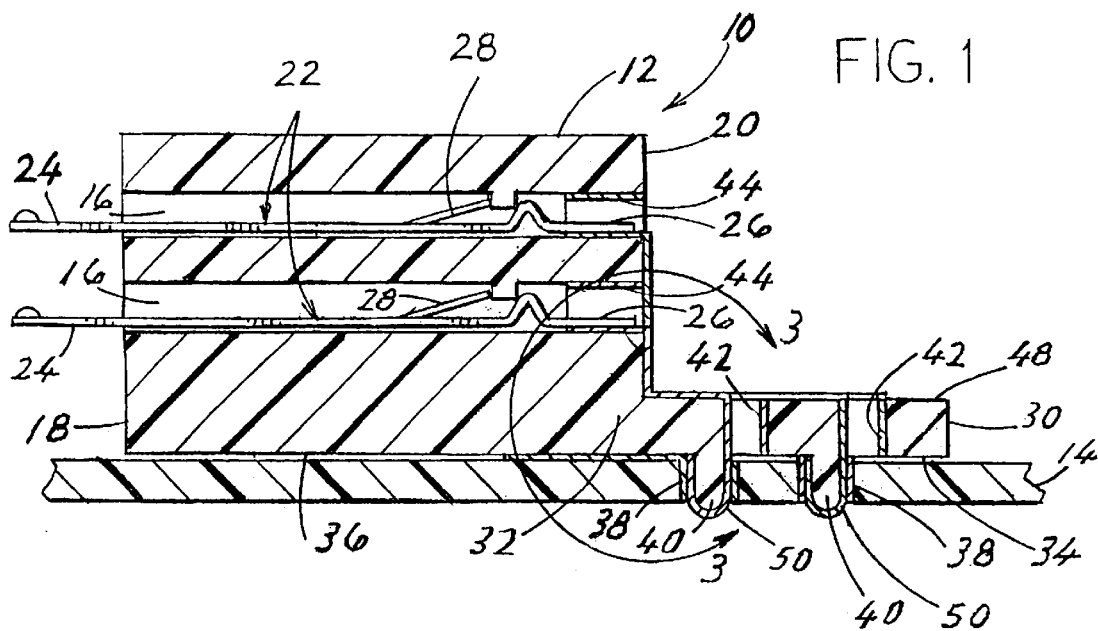
FIG. 1 is a vertical sectional view through one embodiment of the right angle connector of the present invention, shown mounted on a printed circuit board.
Figure 2:
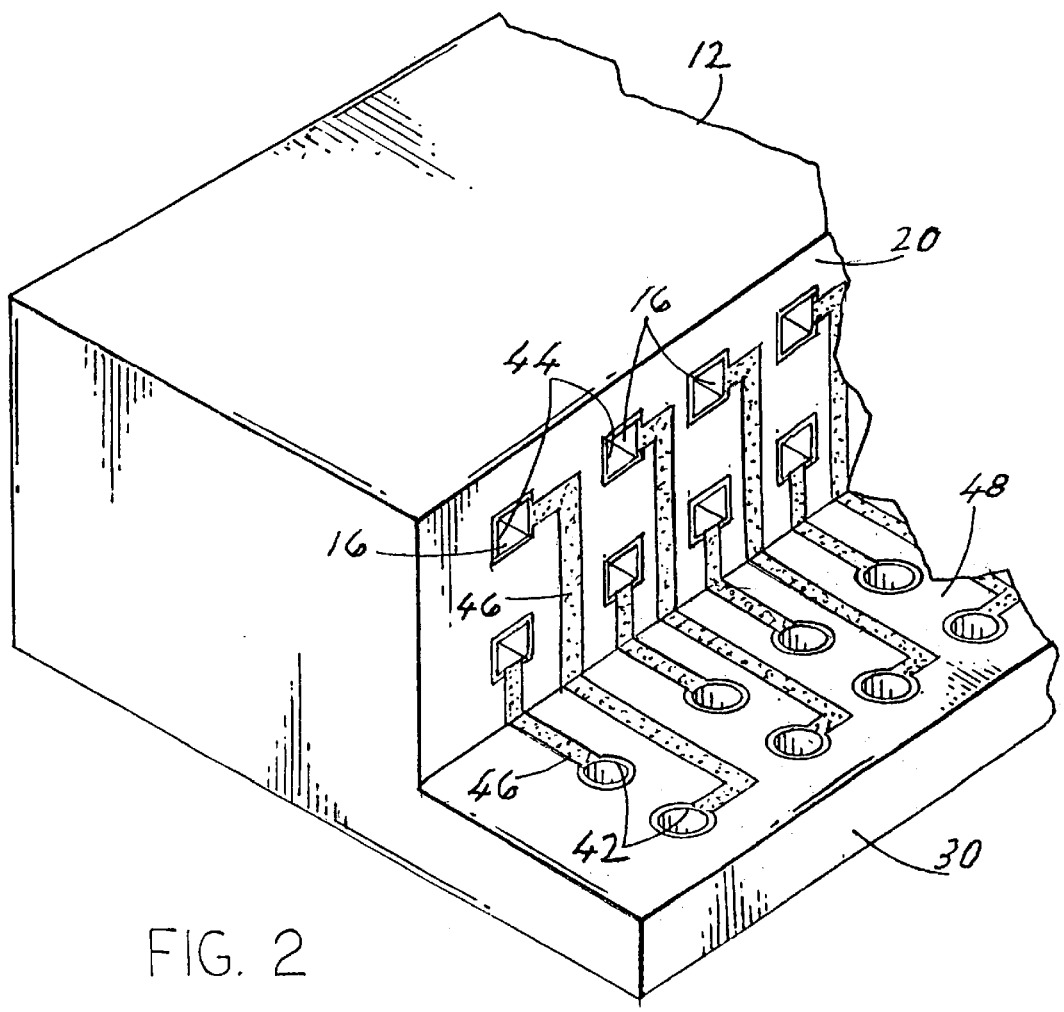
FIG. 2 is an isometric view of one end portion of the insulative body of the connector illustrated in FIG. 1.
Figure 3:
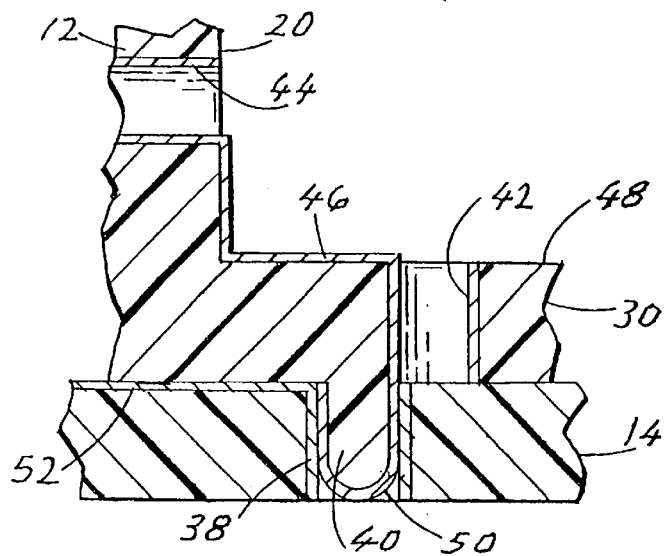
FIG. 3 is an enlarged view of the portion of FIG. 1 encircled by line 3—3 illustrating the conductive traces and plated peg on the insulative body and plated holes in the body and printed circuit board.

Referring now to the drawings in detail, there is shown in FIGS. 1–3 one embodiment of the right angle electrical connector of the present invention, generally designated 10, in which the right angle feature of the connector is integrally formed with the insulative body 12 of the connector. As seen in FIG. 1, the connector 10 is mounted on a printed circuit board 14. The insulative body 12 may be a molded thermoplastic. A plurality of rows of contact passages 16 are provided in the body 12. While two rows of passages are shown in FIGS. 1 and 2, additional rows may be employed such as used in the second embodiment of the invention described later herein. The contact passages 16 extend from the front mating face 18 of the insulative body to the rear face 20 thereof. A plurality of contacts 22 are mounted in the contact passages 16. Each contact includes a forward mating end 24 that extends forwardly from the front mating face 18 of the connector, and a rear end 26 which, in this embodiment, terminates at the rear face 20 of the body 12. Contact retention fingers 28 retain the contacts in the passages 16. A potting material, not shown, may fill the rear of each passage 16 around the rear end 26 of the contact to provide a sealed connector.

The connector 10 described so far is a straight connector, since the contacts 22 are straight rather than right angle contacts. To make the connector 10 a right angle connector, without the use of right angle bent tails on the contacts, according to the invention there is provided a flat insulative plate 30 that extends rearwardly from the lower portion 32 of the insulative body 12 generally perpendicular to the front face 18 of the body. The plate is substantially flat in that no curves are provided to enhance bending of the plate (a curved plate is shown in U.S. Pat. No. 5,030,113). The plate 30 is integrally formed with the insulative body 12. The lower surface 34 of the plate 30 is coplanar with the lower surface 36 of the body 12. The plate 30 is disposed over two rows of plated-through holes 38 in the printed circuit board 14. Two rows of projections 40 extend downwardly from the lower surface 34 of the plate 30 into the plated-through holes 38. Two rows of plated-through holes 42 are provided in the plate 30 offset from, but immediately adjacent to, the projections 40 and the holes 38 in the printed circuit board.

A conductive coating 44 is formed on the walls of the rear of each of the contact passages 16. Conductive traces 46 extend from the conductive coatings 44, over the rear-face 20 of the body 12, over the upper surface 48 of the plate 30 to corresponding plated-through holes 42 to provide electrical paths from the conductive coatings in the contact passages to the plated-through holes 42. The plating on each through hole 42 extends to a conductive layer 50 covering the outer surface of the corresponding projection 40. In this embodiment, each projection is preferably in the form of a cylindrical peg having a rounded lower end. The pegs extend vertically when the plate is horizontal, so the cylindrical outer surface of each peg extends straight and vertical as seen in a sectional view of the peg as in FIG. 1. The rear ends of the contacts 22 are in electrical engagement with the conductive coatings 44 in the contact passages. As a consequence, the conductive traces 46 on the insulative body and plate 30 provide an electrical path between the contacts 22 to the plated-through holes 38 in the printed circuit board 14 via the plated holes 42 in the plate 30 and the conductive coated pegs 40. A conductive trace 52 on the upper surface of the board 14 connects to the plated-through hole 38.

Thus, by the present invention there is provided a right angle electrical connector without the use of right angle bent contacts by providing suitable conductive layers and traces on the connector body to provide electrical communication between the straight contacts of the connector and conductive traces on a printed circuit board.

While the holes 42 have been described as plated-through holes, it is not necessary that the entire walls of the holes be plated. For example, the plating on each hole may be simply a narrow conductive trace that extends from the corresponding trace 46 on the upper surface of the lower plate 30 to the conductive layer 50 on the corresponding peg 40.

Reference is now made to FIGS. 4–8 that show the second embodiment of the invention, in which the right angle feature of an electrical connector is provided by means of a separate adapter that can be assembled to the rear of a conventional straight connector. A conventional straight connector of the type with which an adapter would have particular advantage is a high density connector having multi-rows of contacts, such as a zero insertion force connector device, generally designated 60, illustrated in FIG. 4.

The connector device comprises a plug assembly 62 and a mating receptacle assembly 64. The plug assembly 62 comprises a conventional zero insertion force plug connector 66 and the novel adapter 68 of the present invention, while the receptacle assembly 64 comprises a conventional zero insertion force receptacle connector 70 having a second identical adapter 68a.

Figure 4:
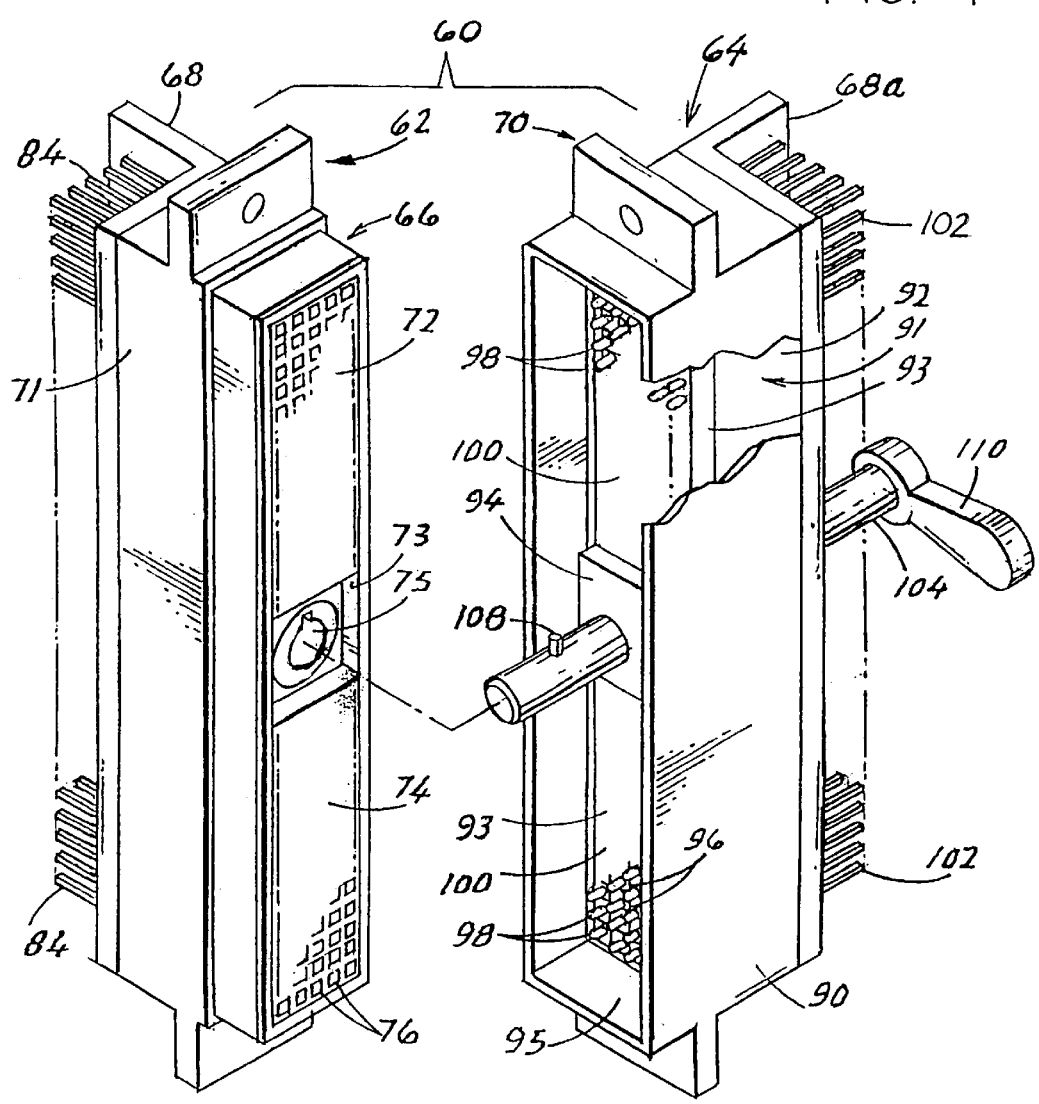
FIG. 4 is a perspective view of a connector device according to the preferred embodiment of the invention having right angle adapters, with the plug assembly and receptacle assembly shown prior to mating, and a portion of the receptacle shell removed to show the insulative bodies therein.
Figure 5:
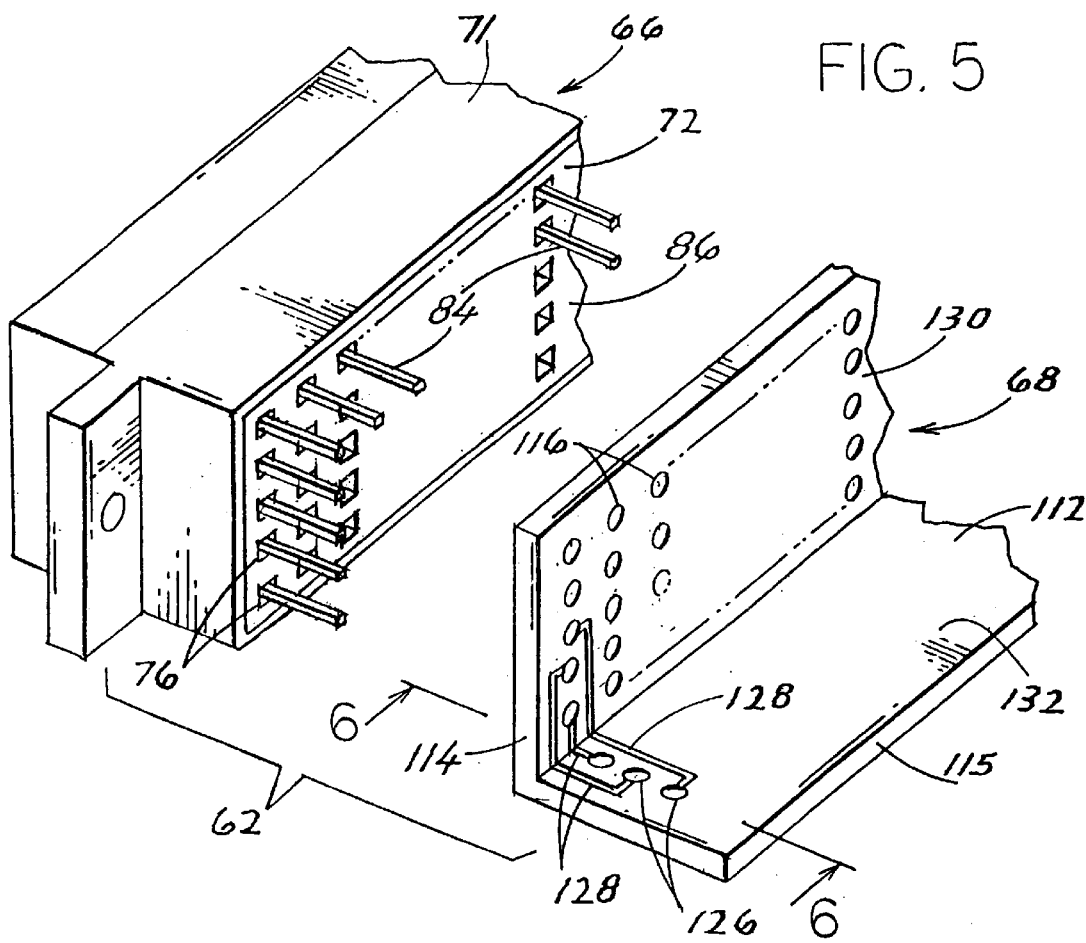
FIG. 5 is an exploded isometric view of one end of the plug assembly of FIG. 4, as viewed from the rear, showing the adapter separated from the plug connector.

As seen in FIGS. 4 and 5, the plug connector 66 comprises a metal shell 71 that surrounds an insulative body 72. The body 72 may be formed of molded plastic. Alternatively, the part forming the shell may be of plastic integrally molded with the body 72. A central rectangular recess 73 is formed in the front face 74 of the body 72. A bore 75 is formed in the bottom of the recess.

Figure 6:
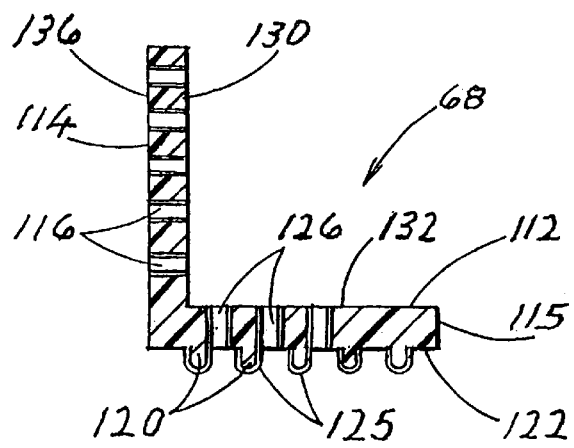
FIG. 6 is a vertical sectional view taken along line 6—6 of FIG. 5 showing details of the adapter.
Figure 8:
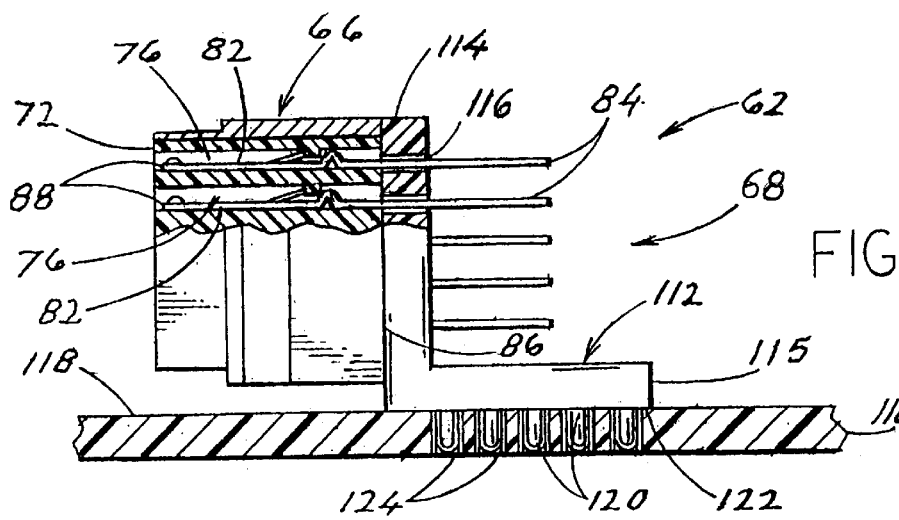
FIG. 8 is a partial vertical sectional view through the plug assembly of FIG. 5 mounted on a printed circuit board also shown in vertical section.

As seen in FIGS. 5, 6, and 8, there are five rows of contact passages 76 that extend through the insulative body 72. Contacts 82 are mounted in the contact passages 76. The contacts may be similar to the contacts 22 described in connection with the first embodiment of the invention, except that the rear ends of the contacts are in the form of tails or posts 84 that extend rearwardly from the rear face 86 of the body 72. The forward mating ends 88 of the contacts are disposed within the contact passages behind the front face 74 of the body 72.

Referring again to FIG. 4, the receptacle connector 70 is also a conventional zero insertion force connector, having an outer metal shell 90 that surrounds an insulative body 91. The body 91 comprises a rear insulator 92 and two slidable actuator plates 93 in front of the insulator 92 on opposite sides of a central rectangular boss 94. The forward end of the shell 90 forms a recess 95 that receives the forward portion of the shell 71 of the plug connector 66 when the plug connector and receptacle connector are mated.

A plurality of contact passages 96 are formed in the insulative body 91 corresponding in number and position with the contact passages 76 in the plug connector. Contacts 98 mounted in the passages 96 have forward ends extending beyond the front faces 100 of the actuator plates 93, and rear ends in the form of posts or tails 102 that extend beyond the rear face of the body.

A cam shaft 104 is mounted in the central portion of the insulative body 91. The cam shaft has an elliptical-shaped actuating cam (not shown) located between the actuator plates 93, and a forward locking pin 108. A handle 110 is provided on the rear of the cam shaft. When the plug connector 66 and a receptacle connector 70 are initially mated, the contacts 82 and 98 are out of engagement. The handle 110 is then rotated to rotate the cam shaft 104. This causes the elliptical cam to shift the actuator plates 93 of the receptacle connector 70 laterally in opposite directions to bring the forward ends of the contacts 98 into engagement with the contacts 82 in the plug connector 66. Also, mating of the connectors 66 and 70 causes the locking pin 108 in the cam shaft to enter the bore 75 in the plug connector. Rotation of the cam shaft will cause the locking device to engage a locking shoulder (not shown) in the body 72 to lock the plug and receptacle connectors together. The structure and operation of a zero insertion force connector of the type described herein is illustrated and described in detail in U.S. Pat. No. 3,594,698, the disclosure of which is incorporated herein by reference.

Typically, if the plug connector 66 or receptacle connector 70, or both, are desired to be mounted on a printed circuit board, without the adapter of the present invention the connectors must be mounted vertically so that the contact tails 84 and 102 will extend vertically downwardly through plated-through holes in the board. With the adapters 68 and 68a of the present invention, either one or both of the connectors 66 and 70 may be mounted horizontally on a printed circuit board, since the adapters convert the connectors from straight connectors into right angle connectors. Since the adapter 68a for the receptacle connector 70 is identical to the adapter 68 for the plug connector 66, only the adapter 68 will be described in detail herein.

As seen in FIG. 8, the plug connector 66 with which the adapter 68 is used is mounted horizontally over a printed circuit board 110. As previously mentioned, there are five rows of contact passages 76 in the insulative body 72 of the plug connector. Hence, with the connector mounted horizontally, there are five vertically spaced, horizontally-extending, rows of contact passages. The contact tails 84 extend horizontally from the rear face 86 of the body 72.

According to the invention, the right angle adapter 68 comprises an L-shaped insulative body 112 that provides a vertically-extending upper plate 114 and a horizontally-extending lower plate 115. The upper plate 114 is formed with five rows of plated-through passages 116 that are formed in a pattern corresponding to the pattern of the contact passages 76 in the plug connector 66. The adapter 68 is mounted on the plug connector 66 by aligning the plated-through passages 116 in the upper plate with the contact tails 84 of the plug connector 66 and then pushing the adapter 68 forwardly until the upper plate abuts against the rear surface 86 of the insulative body 72 of the plug connector.

Normally there is a press-fit connection between the tails 84 and the plated-through passages 116 that is sufficient to retain the adapter mounted against the rear of the plug connector 66. A solder connection may also be provided between the tails and the plated-through passages 116. Alternatively, the tails could be compliant pins that have a tight frictional engagement in the plated-through passages. As seen in FIG. 8, the height of the upper plate 114 of the adapter 68 is such that the adapter supports the plug connector 66 above the upper surface 118 of the printed circuit 110.

Figure 7:
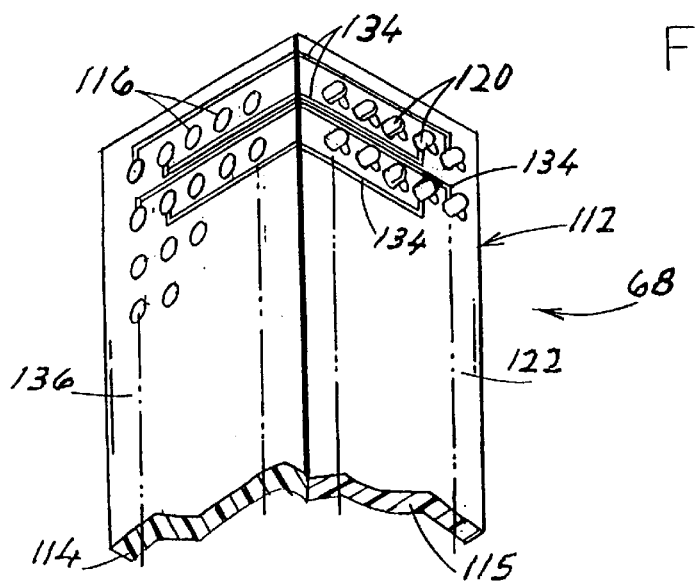
FIG. 7 is an isometric view of one end of the adapter of FIGS. 5 and 6 showing the front face and bottom of the adapter.

As seen in FIGS. 6–8, five rows of projections or pegs 120 extend downwardly from the lower surface 122 of the lower plate 115 of the adapter. The pegs 120 are positioned to match the pattern of five rows of plated-through holes 124 formed in the printed circuit board 110.

As in the first embodiment of the invention, the pegs 120 are covered with conductive layers 125. Three rows of plated-through holes 126 are formed in the lower plate 115 immediately adjacent to the first three rows of pegs 120 so that the conductive layers 125 on the pegs are continuous with the conductive plating on the walls of the holes 126. In addition, conductive traces 128 provide electrical paths between the lower three rows of plated-through holes 116 in the upper plate 114 and the plated-through holes 126. The conductive traces 128 are formed on the rear surface 130 of the upper plate 114 and on the upper surface 132 of the lower plate 115 of the adapter body. Because of the high density of the contacts 82, and lack of surface area on the rear surface 130 and upper surface 132 of the adapter, additional conductive traces 134 are provided on the front surface 136 of the upper plate 114 and on the lower surface 122 of the lower plate 115 that extend from the upper two rows of plated-through passages 116 to the two rearmost rows of pegs 120. Thus, the conductive traces 128 and 134 on the L-shaped insulative body 112 of the adapter 68 provide electrical paths between all the plated-through passages 116 and corresponding conductive coated pegs 120. Hence, with the adapter mounted over the tails 84 of the contacts in the plug connector 66, electrical paths are provided by the adapter from the tails to the plated-through holes 124 in the printed circuit board 10.

While the plug connector 66 and receptacle connector 70 are disclosed herein as having five rows of contacts, it will be understood that a greater number of rows of contacts could be provided by providing additional numbers of plated-through passages 116 and plated pegs 120 on the adapter 68. For example, the adapter of the present invention can be used with commercially available zero insertion force connectors having from 6–12 vertical rows of contact passages, with the number of contacts running in number from 60–360.

Figure 9:
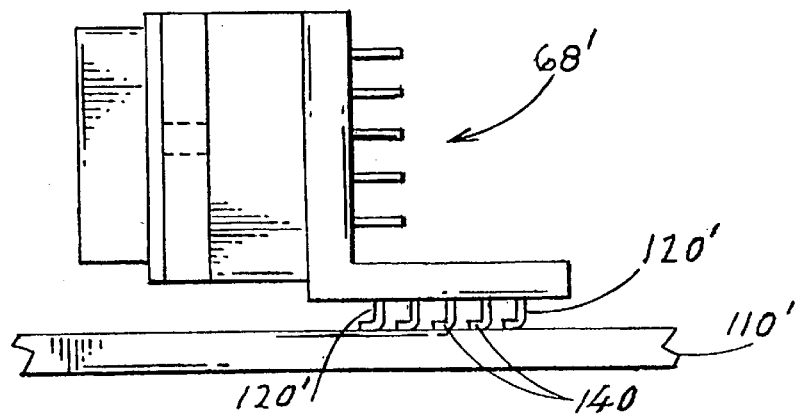
FIG. 9 is an end view of another embodiment of the plug assembly of the invention that is surface mounted to a printed circuit board.

The adapter 68 is not restricted to the use of plated pegs that are mounted in plated-through holes in a printed circuit board. For example, as seen in FIG. 9, an adapter 68' may be provided with metal plated L-shaped projections 120' having flat bottom surfaces 140 that may have a surface mount connection to conductive pads on a printed circuit board 110'. Otherwise, the adapter 68' is identical to the adapter 68.

The conductive traces and layers formed on the insulative body 12 of the right angle connector 10 of the first embodiment of the invention illustrated in FIGS. 1–3, and used on the L-shaped adapters of the embodiments of the invention illustrated in FIGS. 4–9, may be provided by a number of different processes. A preferred process is a two-shot molding method using MID (molded interconnection device) technology such as described in U.S. Pat. Nos. 5,407,622 and 5,626,483. Alternatively, the conductive traces and coatings could be applied by printing, screen printing, silk screening, spraying, vacuum plating, process engraving, pad printing, ink jet, vapor deposition, sputtering, photo-negative or photo-positive masking, electroplating, or the like.

From the foregoing, it is seen that the present invention provides a right angle electrical connector without the need of having right angle contacts, and provides an adapter that can convert a conventional straight contact connector into a right angle connector that can be readily assembled by pushing the adapter over the rear end portions of the straight contacts.

What is claimed is:

1. A right angle electrical connector for mounting on a circuit board, comprising:

an insulative body having a front mating face and a rear face and having a lower portion;

said body containing a plurality of contact passages extending from said front face to said rear face;

a plurality of contacts mounted in said passages, each of said contacts having a forward mating end adjacent to said front face and a rear end adjacent to said rear face;

said passages having rear passage portions with conductive coating therein that are each engaged by the rear end of one of said contacts;

a substantially flat insulative plate portion extending rearwardly from the lower portion of said body and generally perpendicular to said front face, said plate portion having a lower surface for mounting on said printed circuit board;

a plurality of projections extending downwardly from said lower surface of said plate portion, said projections formed of insulative material and having conductive layers thereon; and conductive traces on said body extending from said conducive coatings in said passages, over said plate portion to said conductive layers on said projections to thereby provide electrical paths from said contacts to said projections.

2. An electrical connector as set forth in claim 1 wherein:

said body includes a forward part and a separate rear part, said flat plate is integrally formed with said rear part.

3. An electrical connector as set forth in claim 1 wherein:

said projections are pegs adapted to be mounted in plated-through holes in the printed circuit board, with said pegs having outer surfaces that extend straight and vertically, as seen in a sectional view of the peg, when said plate portion lower surface lies in a horizontal plane; and said conductive layers are formed on said vertically-extending outer surfaces of said pegs.

4. An electrical connector as set forth in claim 3 wherein:

holes extend through said plate adjacent to and at a side of each of said pegs, with said holes having walls; and said conductive traces include conductive platings on the walls of said holes joined to said conductive layers on said pegs.

5. An electrical connector as set forth in claim 1 wherein:

said projections have flat bottoms and said conductive layers on said projections extend to the bottom of said projections for surface mounting to said printed circuit board.

6. A right angle electrical connector comprising:

an insulative connector body having a front mating face and a rear face;

said connector body containing a plurality of contact passages extending from said front face to said rear face;

a plurality of contacts mounted in said passages, with each of said contacts having a forward mating end adjacent to said front face and a rear end extending rearwardly beyond said rear face;

an adapter comprising a generally L-shaped insulative adapter body, including a vertically-extending upper plate and a horizontally-extending lower plate, said upper plate being mounted adjacent to said rear face of said adapter body;

plated-through passages in said upper plate aligned with said contact passages, said rear ends of said contacts extending through said plated-through passages in electrical engagement therewith;

said lower plate having a lower surface for mounting over a printed circuit board;

a plurality of projections extending downwardly from said lower surface of said lower plate, said projections having conductive layers thereon; and conductive traces on said adapter body extending from said plated-through passages, on at least one surface of said upper plate, and on at least one surface of said lower plate to said conductive layers on said projections to thereby provide electrical paths from said contacts to said projections.

7. An electrical connector as set forth in claim 6 wherein:

said projections are pegs adapted to be mounted in plated-through holes in the printed circuit board, with said pegs having straight vertical outer surfaces; and said conductive layers are formed on the outer surface of said pegs.

8. An electrical connector as set forth in claim 7 wherein:

holes extend through said lower plate adjacent to and beside said pegs, said holes having walls; and said conductive traces include conductive plating on the walls of said holes joined to said conductive layers on said pegs.

9. An electrical connector as set forth in claim 6 wherein:

said projections have flat bottoms, and said conductive layers on said projections extend to the bottoms of said projections for surface mounting to said printed circuit board.

10. An electrical connector as set forth in claim 6 wherein:

said upper and lower plates each has opposite surfaces;

said conductive traces are formed on both of said surfaces of said lower plate, and on both of said surfaces of said upper plate.

11. An electrical connector as set forth in claim 6 wherein:

more than three horizontally-extending rows of said contact passages are provided in said connector body;

a number of horizontally-extending rows of said plated-through passages are provided in said upper plate of said adapter body corresponding to said number of rows of contact passages; and a number of rows of said projections are provided on said lower plate of said adapter corresponding to said number of rows of said contact passages.

12. An adapter for converting a straight contact electrical connector to a right angle electrical connector for mounting on a circuit board comprising:

an L-shaped insulative body, including a generally vertically-extending upper plate and a generally horizontally-extending lower plate;

plated-through passages in said upper plate for receiving the rear ends of contacts in said straight-contact electrical connector;

said lower plate having a lower surface for mounting over the printed circuit board;

a plurality of projections extending downwardly from said lower surface of said lower plate, said projections having conductive layers thereon; and conductive traces on said insulative body extending from said plated-through passages, over the surface of said upper and lower plates to said conductive layers on said projections to thereby provide electrical paths from said plated-through holes to said projections.

13. A combination of a horizontal circuit board with upper and lower faces and a plurality of plated holes, and a connector with an insulative body lying over of said circuit board, said body having front and rear faces and horizontally-extending body passages extending between said faces, said connector having a plurality of contacts each lying in one of said passages, wherein:

said connector includes an insulative flat plate portion with a plate lower surface lying facewise against said circuit board upper face, with said flat plate portion having a plurality of downward projections projecting into said circuit board holes;

a plurality of quantities of conductive material, each quantity plating a rear portion of one of said body passages and engaging one of said contacts, extending downwardly from said one of said body passages along said body rear face, extending horizontally along said flat plate portion, and extending onto one of said projections to engage a plated hole of said circuit board.

* * * * *